(12) United States Patent
Chang et al.

(10) Patent No.: US 10,154,166 B2
(45) Date of Patent: *Dec. 11, 2018

(54) IMAGE SENSOR PANEL AND METHOD FOR CAPTURING GRAPHICAL INFORMATION USING SAME

(71) Applicant: Bidirectional Display Inc., Acton, MA (US)

(72) Inventors: Hsuan-Yeh Chang, Chestnut Hill, MA (US); Anping Liu, Acton, MA (US)

(73) Assignee: Bidirectional Display Inc., Acton, MA (US)

( * ) Notice: Subject to any disclaimer, the term of this patent is extended or adjusted under 35 U.S.C. 154(b) by 210 days.

This patent is subject to a terminal disclaimer.

(21) Appl. No.: 15/268,624

(22) Filed: Sep. 18, 2016

(65) Prior Publication Data

US 2017/0078513 A1 Mar. 16, 2017

Related U.S. Application Data

(63) Continuation of application No. PCT/US2015/021199, filed on Mar. 18, 2015.

(Continued)

(51) Int. Cl.
*H04N 1/10* (2006.01)
*G06F 3/042* (2006.01)
(Continued)

(52) U.S. Cl.
CPC ........... *H04N 1/10* (2013.01); *G02F 1/13338* (2013.01); *G02F 1/133512* (2013.01);
(Continued)

(58) Field of Classification Search
CPC ...... G06F 3/0412; G06F 3/042; G06F 3/0304; G06F 3/0484; G06F 3/0488;
(Continued)

(56) References Cited

U.S. PATENT DOCUMENTS 5,243,332 A    9/1993 Jacobson
5,483,263 A *  1/1996 Bird ................... G02F 1/13338
                                              345/104

(Continued)

FOREIGN PATENT DOCUMENTS

WO    2012/163312    12/2012
WO    2013/173838    11/2013
WO    2014/060693     4/2014

OTHER PUBLICATIONS

Geoff Walker et al., "LCD In-Cell Touch," Information Display Mar. 2010, SID 2010 (8 pages).

(Continued)

*Primary Examiner* — Dmitriy Bolotin
(74) *Attorney, Agent, or Firm* — Hsuanyeh Law Group, PC

(57) ABSTRACT

The present disclosure provides an image sensor panel and a method for capturing graphical information using the image sensor panel. In one aspect, the image sensor panel includes a substrate and a sensor array on the substrate, the sensor array including a plurality of photosensitive pixels. The substrate includes a first region defined by the sensor array and a second region other than the first region. The second region is optically transparent and has an area greater than that of the first region.

12 Claims, 9 Drawing Sheets

Related U.S. Application Data

(60) Provisional application No. 62/025,772, filed on Jul. 17, 2014, provisional application No. 61/955,223, filed on Mar. 19, 2014.

(51) Int. Cl.

| | | |
|---|---|---|
| *G09F 9/35* | (2006.01) | |
| *G09G 3/36* | (2006.01) | |
| *G06F 3/0488* | (2013.01) | |
| *G06F 3/03* | (2006.01) | |
| *G06F 3/0484* | (2013.01) | |
| *G02F 1/1333* | (2006.01) | |
| *G02F 1/1335* | (2006.01) | |
| *H01L 27/146* | (2006.01) | |
| *H01L 27/32* | (2006.01) | |
| *H01L 31/105* | (2006.01) | |
| *H04N 5/335* | (2011.01) | |
| *G09G 3/34* | (2006.01) | |

(52) U.S. Cl.
CPC ............ *G06F 3/0304* (2013.01); *G06F 3/042* (2013.01); *G06F 3/0484* (2013.01); *G06F 3/0488* (2013.01); *G09F 9/35* (2013.01); *G09G 3/36* (2013.01); *H01L 27/14605* (2013.01); *H01L 27/14607* (2013.01); *H01L 27/14612* (2013.01); *H01L 27/14623* (2013.01); *H01L 27/14636* (2013.01); *H01L 27/14645* (2013.01); *H01L 27/14649* (2013.01); *H01L 27/323* (2013.01); *H01L 27/3234* (2013.01); *H01L 31/1055* (2013.01); *H04N 5/335* (2013.01); *G09G 3/3413* (2013.01); *G09G 2300/04* (2013.01); *G09G 2360/14* (2013.01)

(58) Field of Classification Search
CPC .. G09G 3/3413; G09G 5/003; G09G 2300/04; G09G 2360/14; G09G 3/36; G02F 1/13338; G02F 1/133512; G09F 9/35; H01L 27/14605; H01L 27/14607; H01L 27/14612; H01L 27/14623; H01L 27/14636; H01L 27/14645; H01L 27/14649; H01L 27/323; H01L 27/3234; H01L 31/1055; H04N 1/10; H04N 5/335
See application file for complete search history.

(56) References Cited

U.S. PATENT DOCUMENTS

| | | | | |
|---|---|---|---|---|
| 5,917,464 A * | 6/1999 | Stearns | ................ | G02F 1/1354 |
| | | | | 345/207 |
| 75,354,668 | 5/2009 | Uy | | |
| 8,760,431 B2 * | 6/2014 | Ahn | ..................... | G06F 1/3203 |
| | | | | 345/174 |
| 8,896,577 B2 | 11/2014 | Ahn et al. | | |
| 8,947,411 B2 * | 2/2015 | Beon | ..................... | G06F 3/0412 |
| | | | | 345/207 |
| 8,982,099 B2 | 3/2015 | Kurokawa | | |
| 2005/0200293 A1 * | 9/2005 | Naugler, Jr. | ......... | G06F 3/03542 |
| | | | | 315/149 |
| 2008/0266273 A1 * | 10/2008 | Slobodin | ............. | G02F 1/13338 |
| | | | | 345/174 |
| 2009/0283772 A1 | 11/2009 | Cho et al. | | |
| 2009/0295692 A1 * | 12/2009 | Lee | ..................... | G02F 1/13338 |
| | | | | 345/87 |
| 2010/0231495 A1 | 2/2010 | Kang et al. | | |
| 2010/0193804 A1 * | 8/2010 | Brown | ................ | G02F 1/13318 |
| | | | | 257/84 |
| 2010/0283771 A1 * | 11/2010 | Lee | ..................... | G02F 1/13338 |
| | | | | 345/207 |
| 2010/0321341 A1 * | 12/2010 | Cho | ....................... | G06F 3/0412 |
| | | | | 345/175 |
| 2011/0018893 A1 * | 1/2011 | Kim | ..................... | G06F 3/0412 |
| | | | | 345/589 |
| 2011/0032461 A1 * | 2/2011 | Cho | ......................... | C22C 28/00 |
| | | | | 349/116 |
| 2011/0057189 A1 * | 3/2011 | Jeong | .................... | G06F 3/0412 |
| | | | | 257/59 |
| 2011/0128428 A1 | 6/2011 | Takatoku et al. | | |
| 2012/0138775 A1 * | 6/2012 | Cheon | ..................... | H04N 5/361 |
| | | | | 250/208.1 |
| 2013/0076695 A1 * | 3/2013 | Gomez | .................... | G06F 3/042 |
| | | | | 345/175 |
| 2013/0141354 A1 * | 6/2013 | Tsai | ..................... | G06F 1/1686 |
| | | | | 345/173 |
| 2013/0194192 A1 | 8/2013 | Andolina | | |
| 2013/0278577 A1 * | 10/2013 | Beon | ..................... | G06F 3/0412 |
| | | | | 345/207 |
| 2013/0300695 A1 | 11/2013 | Cho et al. | | |
| 2014/0022431 A1 * | 1/2014 | Chen | ................. | H01L 27/14643 |
| | | | | 348/308 |
| 2014/0085245 A1 * | 3/2014 | Baldwin | ................ | G06F 3/042 |
| | | | | 345/174 |
| 2014/0110695 A1 | 4/2014 | Benwadih | | |
| 2014/0036168 A1 | 6/2014 | Ludwig | | |
| 2014/0167046 A1 | 6/2014 | Shieh et al. | | |
| 2014/0241595 A1 | 8/2014 | Bernstein et al. | | |
| 2014/0300574 A1 | 10/2014 | Benkley et al. | | |
| 2014/0339552 A1 | 11/2014 | Sasagawa et al. | | |
| 2014/0354905 A1 * | 12/2014 | Kitchens | ............... | G06F 1/3215 |
| | | | | 349/12 |
| 2015/0036065 A1 | 2/2015 | Yousefpor et al. | | |
| 2015/0054793 A1 | 2/2015 | Ahn et al. | | |
| 2015/0098031 A1 | 4/2015 | Kurokawa | | |
| 2015/0136860 A1 | 5/2015 | Sløgedal et al. | | |

OTHER PUBLICATIONS

Richard L. Weisfield et al., "Performance analysis of a 127-micron pixel large-area TFT/photodiode array with boosted fill factor," SPIE Proceedings vol. 5368: Medical Imaging 2004: Physics of Medical Imaging, May 6, 2004 (11 pages).

Nur Sultan Salahuddin et al., "Design of Thin-Film-Transistor (TFT) arrays using current mirror circuits for Flat Panel Detectors (FPDs)," Proceedings of the International Conference on Electrical Engineering and Informatics, Institut Teknologi Bandung, Indonesia, Jun. 17-19, 2007 (3 pages).

International Search Report and Written Opinion, dated Jun. 18, 2015, in related International Application No. PCT/US2015/021199 (8 pages).

* cited by examiner

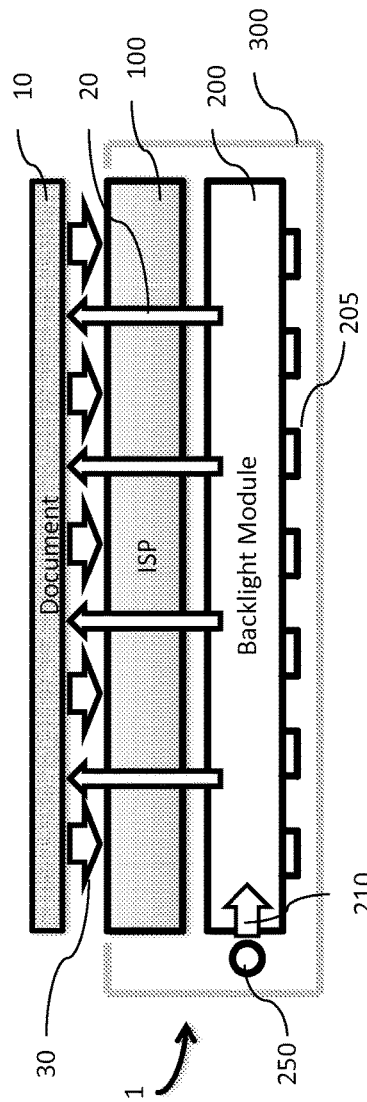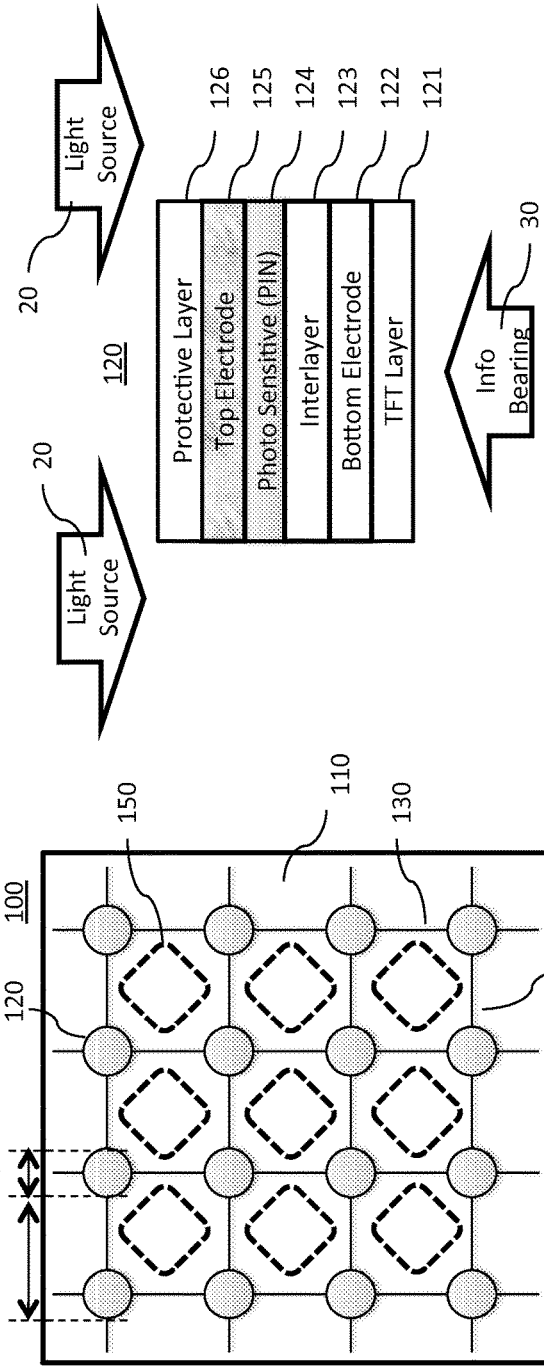

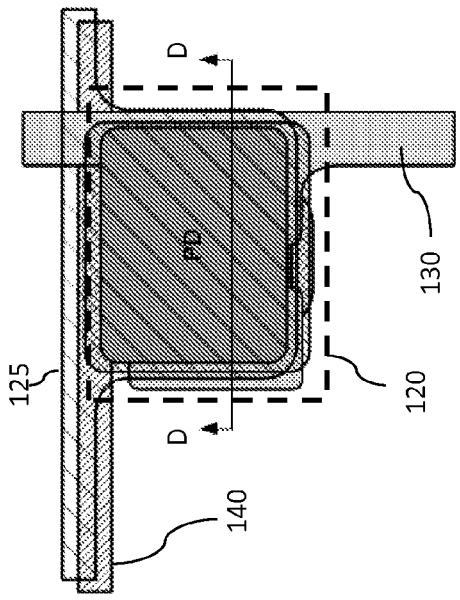
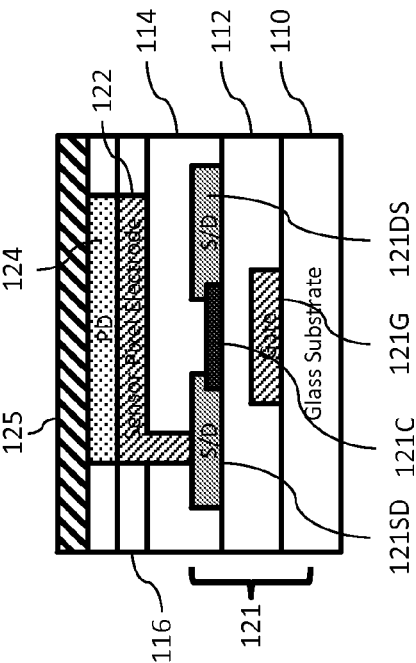
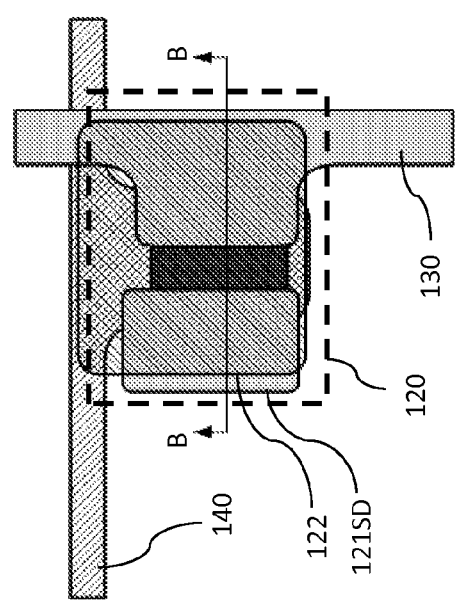
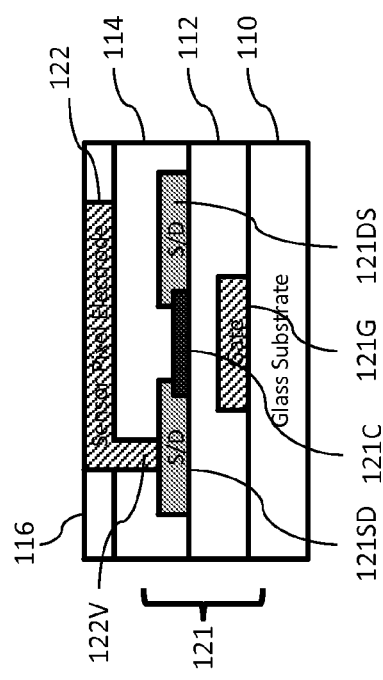
FIG. 4A
FIG. 4B
FIG. 4C
FIG. 4D

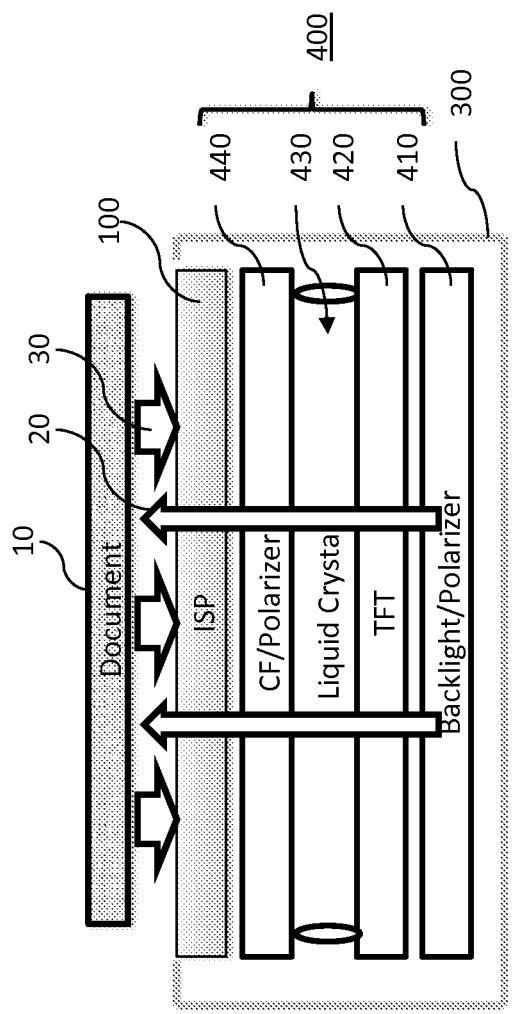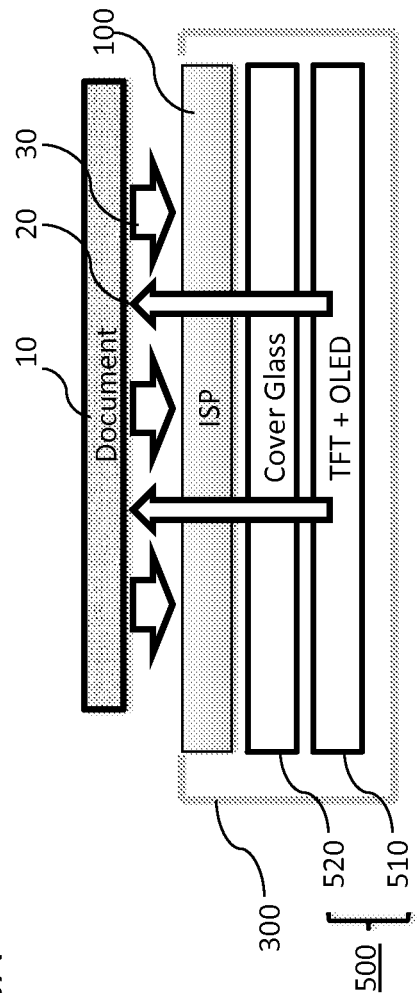
FIG. 5A
FIG. 5B

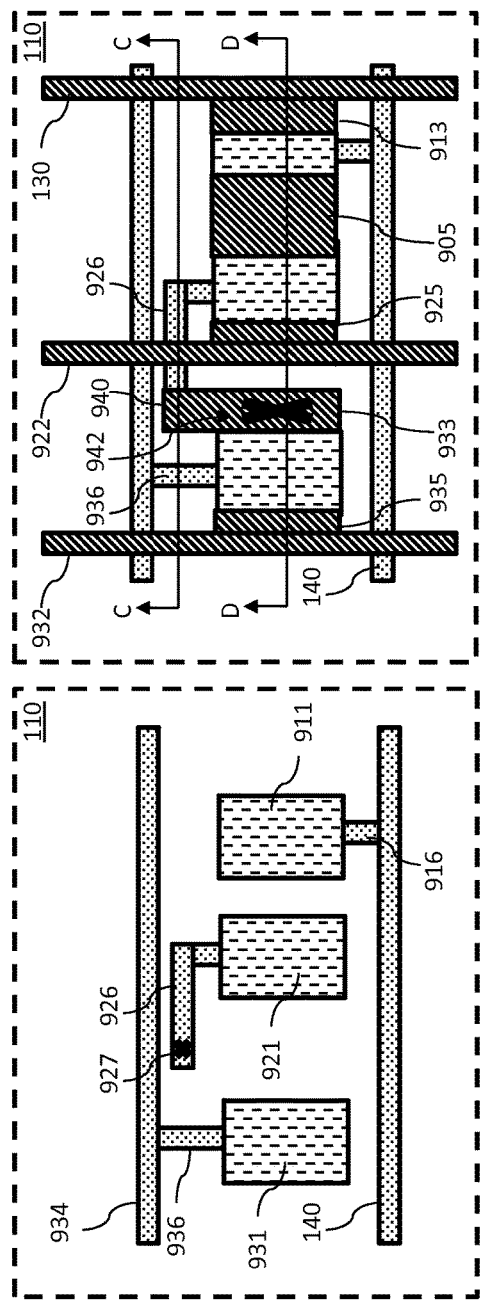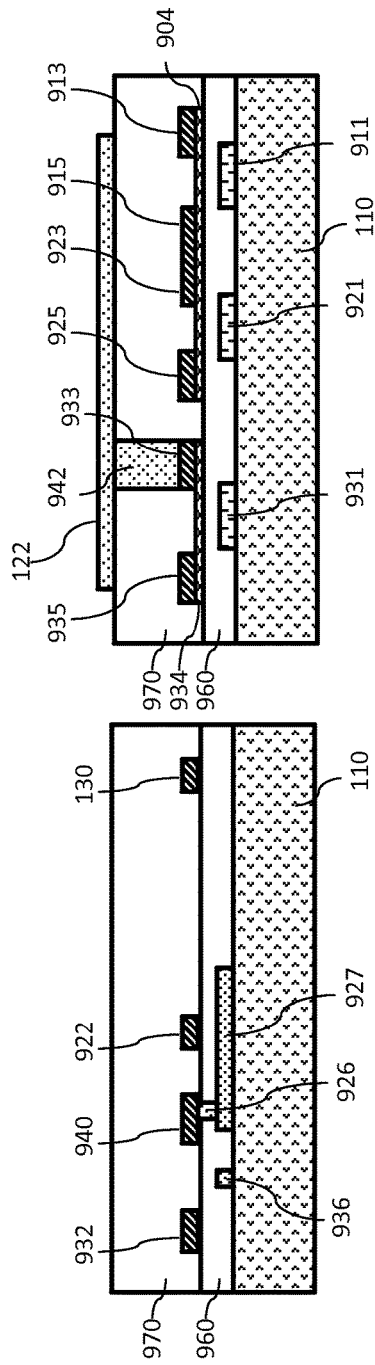
FIG. 10A
FIG. 10B
FIG. 10C
FIG. 10D

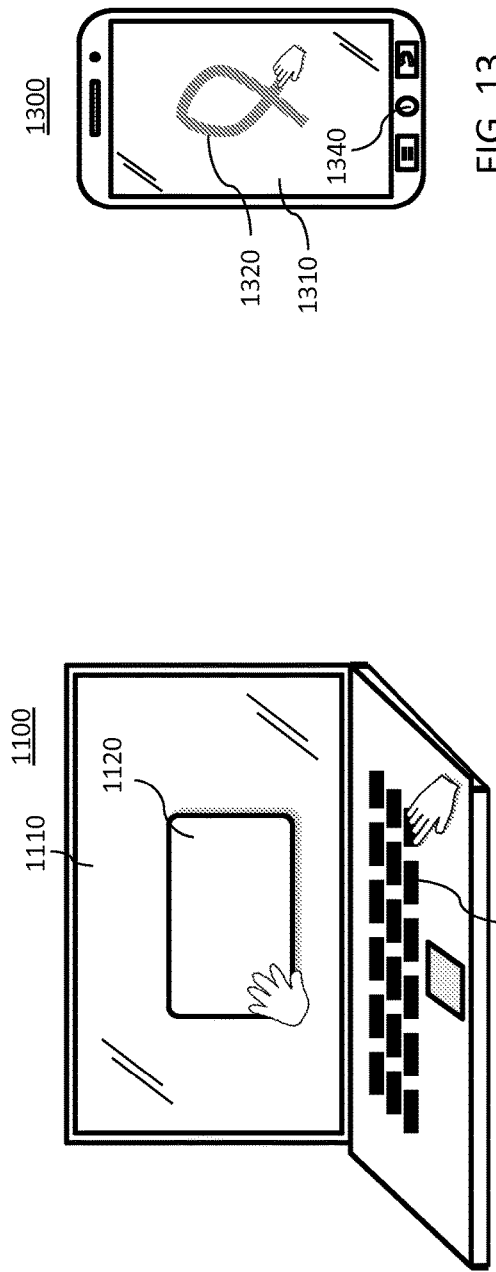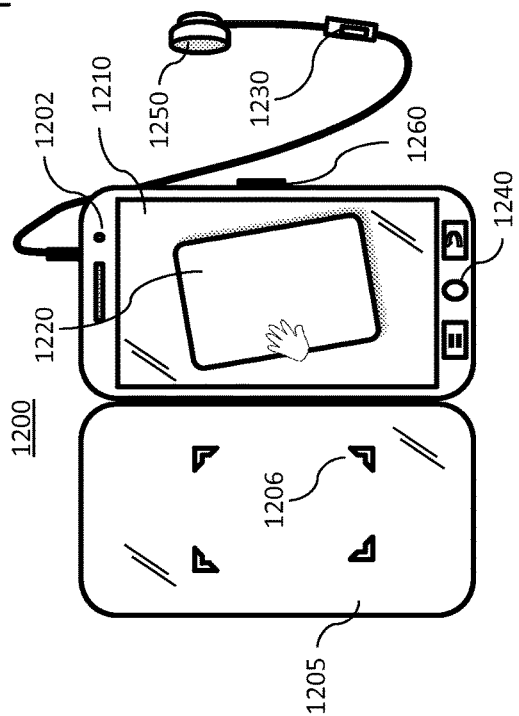

IMAGE SENSOR PANEL AND METHOD FOR CAPTURING GRAPHICAL INFORMATION USING SAME

RELATED APPLICATIONS

This application claims the benefit under 35 USC § 365(c) to International Application No. PCT/US15/21199, filed Mar. 18, 2015, which claims the benefit of priority to U.S. Provisional Application No. 61/955,223, filed Mar. 19, 2014, and U.S. Provisional Application No. 62/025,772, filed Jul. 17, 2014, the entire contents of all of which are incorporated herein by reference for all purposes.

TECHNICAL FIELD

The present disclosure relates to an image sensor panel and a method for capturing graphical information using the image sensor panel. More particularly, the present disclosure relates to an image sensor panel including an array of photosensitive pixels, and a method for capturing graphical information from a two-dimensional information bearing substrate (IBS) using the image sensor panel.

BACKGROUND

Flat panel displays have been used ubiquitously as a standard output device for various electronic devices, such as, personal computers, laptop computers, smartphones, smart watches, televisions, handheld video game devices, a public information display, and the like. Recently, flat panel displays have been developed to include input functionalities (e.g., touch screens that are sensitive to either pressure or capacitance changes in response to user touches or interactions), such that the flat panel displays can be used as both an input (pointer) device and an output device. A touch screen can interact with the user and detect one or more of user's finger point contacts and/or drawings on the screen as input signals. However, a touch screen cannot capture graphical information from the two-dimensional surface of an information bearing substrate.

Many electronic devices, such as smartphones and laptop computers, have been developed to include a camera disposed before or behind their flat panel displays pointing to a direction same or opposite to the light emission direction of the displays. Although such a camera can be used to capture images (still or moving pictures) as an input, the camera requires focus and the captured images are often distorted or of low quality due to, for example, a shaky hand.

Accordingly, there is a need to develop a new image sensor panel that can be easily integrated with a display panel (flat or curved) and can easily capture graphical information from the two-dimensional surface of an information bearing substrate without having to focus. There is also a need to develop a new method for capturing graphical, textual, or other information from the information bearing substrate using the combination of an image sensor panel and a display panel.

SUMMARY

In one aspect, the present disclosure provides an image sensor panel, comprising a substrate; and a sensor array on the substrate, the sensor array including a plurality of photosensitive pixels. The substrate comprises a first region defined by the sensor array and a second region other than the first region. The second region is optically transparent and has an area greater than that of the first region. In one embodiment, the substrate comprises one of glass, plastic, and a combination thereof.

In one embodiment, the image sensor panel further comprises a plurality of column conductive lines and a plurality of row conductive lines intersecting the column conductive lines. The photosensitive pixels are formed proximate intersections of the column and row conductive lines. In one embodiment, the column and row conductive lines comprise an electrically conductive material that is optically transparent.

In one embodiment, each of the photosensitive pixels has a stacked structure comprising a control component and a photosensitive component. In one embodiment, the control component is formed on the substrate and the photosensitive component is formed on the control component. In one embodiment, the photosensitive component is formed on the substrate and the control component is formed on the photosensitive component. In one embodiment, the control component comprises three thin film transistors.

In one embodiment, the stacked structure further comprises a dielectric layer between the control component and the photosensitive component, the dielectric layer having a via hole, and wherein the control component is electrically coupled to the photosensitive component through the via hole. In one embodiment, the dielectric layer has a thickness between 0.3 to 2.0 microns or at least 0.3 microns.

In one aspect, the present disclosure provides a two-dimensional image scanner comprising a surface light source having a light-emitting surface, and the image sensor panel as summarized above, the image sensor panel being disposed on the light emitting surface of the surface light source. In one embodiment, the image scanner further comprises a light block component formed on the substrate within the first region and between the light emitting surface of the surface light source and the photosensitive pixels of the sensor array.

In one aspect, the present disclosure provides a bidirectional display device, comprising a display module comprising a plurality of display pixels separated by a black matrix, wherein the display pixels emit light from a first surface of the display module; and the image sensor panel as summarized above, the image sensor panel being attached to the first surface of display module. In one embodiment, the photosensitive pixels of the image sensor panel are aligned with the black matrix. In one embodiment, the display pixels of the display module are aligned with the second region of the substrate. In one embodiment, the image sensor panel further comprises a light block component formed on the substrate of the image sensor panel within the first region and between the display module and the photosensitive pixels of the sensor array.

In one aspect, the present disclosure provides a bidirectional display device, comprising: a display module comprising a plurality of display pixels configured to emit light from a first surface of the display module; and an image sensor panel comprising a substrate and a plurality of photosensitive pixels on the substrate, the substrate comprising a first region defined by the photosensitive pixels and a second region other than the first region, the second region being optically transparent and having an area greater than that of the first region; wherein the image sensor panel is attached to the first surface of the display module.

In one embodiment, the display module comprises a liquid crystal display (LCD) module, and the display pixels are separated by a black matrix of the liquid crystal display module; and wherein the photosensitive pixels of the image sensor panel are aligned to the black matrix of the display module. In one embodiment, the image sensor panel further comprises a light block component formed on the substrate of the image sensor panel within the first region and between the display module and the photosensitive pixels of the sensor array.

In one embodiment, the display module comprises an organic light emitting diode (OLED) display and the display pixels of the display module are aligned with the second region of the substrate. In one embodiment, the image sensor panel further comprises a light block component formed on the substrate of the image sensor panel within the first region and between the display module and the photosensitive pixels of the sensor array. In one embodiment, the display pixels are configured to have a display resolution and the photosensitive pixels are configured to have a sensor resolution, and wherein the sensor resolution is at least 1.5 times of the display resolution.

In one aspect, the present disclosure provides a method for capturing graphical information from an information bearing substrate, the method comprising: contacting an information bearing substrate with a surface of an image sensor panel, the image sensor panel comprising an array of photosensitive pixels and an optically transparent region between the photosensitive pixels; emitting probing light from a light source to the information bearing substrate through the optically transparent region of the image sensor panel; detecting reflected light from the information bearing substrate using the photosensitive pixels to obtain raw image data; generating a digital image data file from the raw image data; and storing the digital image data file in a computer storage medium.

In one embodiment, the method further comprises, after contacting the information bearing substrate with the surface of the image sensor panel, determining a boundary of the information bearing substrate.

In one embodiment, emitting the probing light comprises emitting the probing light from a portion of the light source that corresponds to a surface area defined by the boundary of the information bearing substrate.

In one embodiment, the method further comprises determining conformity of the information bearing substrate placed on the image sensor panel.

In one embodiment, the method further comprises: loading the digital image data file from the computer storage medium; and extracting textual information from the digital image data file by performing an optical character recognition process.

In one embodiment, the method further comprises: generating a composite data file including image data and the extracted textual information; and storing the composite data file in the computer storage medium.

In one embodiment, the method further comprises: generating a text data file including the extracted textual information; and storing the text data file in the computer storage medium.

In one embodiment, emitting the probing light comprises emitting the probing light having an intensity-time profile of a Gaussian type with a half-width of less than 1.0 second.

In one embodiment, emitting the probing light comprises sequentially emitting first color probing light, second color probing light, and third color probing light to the information bearing substrate.

In one embodiment, detecting the reflected light comprises sequentially detecting first color reflected light, second color reflected light, and third color reflected light from the information bearing substrate.

In one aspect, the present disclosure provides a computer program product stored in a computer memory, the computer program product when executed by a processor causing the processor to perform the method for capturing graphical information as summarized above.

In one aspect, the present disclosure provides an image sensor panel, comprising a transparent substrate having a first region and a second region, and an array of photosensitive pixels disposed on the transparent substrate within the first region, the photosensitive pixels being separated from each other by the second region. The second region has an area greater than that of the first region.

BRIEF DESCRIPTION OF THE DRAWINGS

FIG. 1 illustrates a sectional view of an input device including an image sensor panel, in accordance with an embodiment of the present disclosure.

FIG. 2 illustrates a plane view of an image sensor panel, in accordance with an embodiment of the present disclosure.

FIG. 3 illustrates a sectional view of a sensor pixel of the image sensor panel as illustrated in FIG. 2.

FIGS. 4A through 4D illustrate a layered structure of a sensor pixel, read by a single thin film transistor (TFT), in accordance with an embodiment of the present disclosure.

FIG. 5A illustrates a sectional view of an image sensor panel in combination with a liquid crystal display (LCD) module, in accordance with embodiments of the present disclosure.

FIG. 5B illustrates a sectional view of an image sensor panel in combination with an organic light emitting diode (OLED) display module, in accordance with embodiments of the present disclosure

FIGS. 10A through 10D illustrate a layered structure of the sensor pixel as illustrated in FIG. 9.

FIG. 11 illustrates a perspective view of a laptop computer comprising an image sensor panel in combination with a display module, when scanning image of an information bearing substrate, in accordance with an embodiment of the present disclosure.

FIG. 12 illustrates a perspective view of a smartphone device comprising an image sensor panel in combination with a display module, when scanning image of an information bearing substrate, in accordance with an embodiment of the present disclosure.

FIG. 13 illustrates a perspective view of a smartphone device comprising an image sensor panel in combination with a display module, when detecting a user's finger drawing, in accordance with an embodiment of the present disclosure.

DETAILED DESCRIPTION

Figure 7:
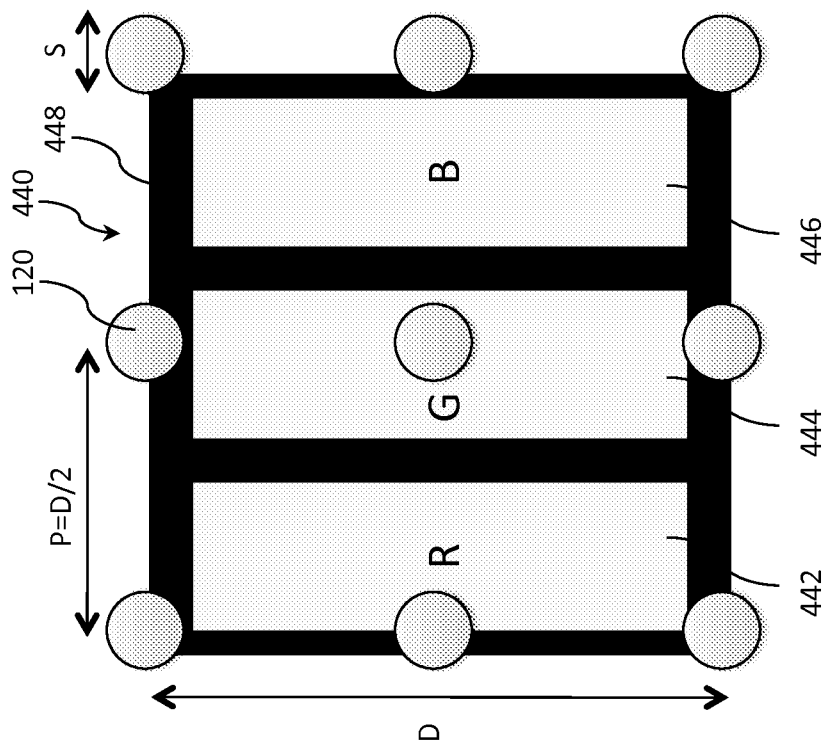
FIG. 7 illustrates a plane view of a sensor pixel array slightly misaligned with a black matrix of a display module, in accordance with an embodiment of the present disclosure.

The term "information bearing substrate" (or IBS) is used herein to refer to any tangible medium having a 2D surface that bears textual, graphical, or other information printed or otherwise attached thereto. In various embodiments, the information bearing substrate can be a document, a photograph, a drawing, a business card, a credit card, a smartphone display screen, a surface of a merchandize package box, a book cover/page, a finger/palm/foot surface, and the like. Unless otherwise provided, the term "image sensor panel" is used herein to refer to an image sensor panel device that includes a plurality of photosensitive pixels (or sensor pixels) formed on a glass/plastic substrate, as shown and described herein. Further, unless otherwise provided, the term "bidirectional display" is used herein to refer to a panel device that includes both a display panel and an image sensor panel, as shown and described herein. In different cases, a bidirectional display may be flat, flexible, or curved.

FIG. 1 illustrates a sectional view of an input device 1 including an image sensor panel 100, in accordance with an embodiment of the present disclosure. Referring to FIG. 1, input device 1 includes image sensor panel (ISP) 100 and a backlight module 200, both being enclosed in a housing 300 with a surface of ISP 100 being optically exposed to the exterior environment. Backlight module 200 comprises a light guide plate (having a square shape, a rectangular shape, or other suitable shapes) with a plurality of light reflectors 205 formed at a bottom surface of the light guide plate, and at least one light source 250, which can be one or more point light sources (e.g., LEDs) at one or more corners of the light guide plate or a linear light source (e.g., a cold cathode fluorescent lamp or CCFL) at a side of the light guide plate.

Backlight module 200 emits a uniform planar light source along a first direction 20 from a top surface of the light guide plate by guiding light 210 from light source 250 and reflecting light 210 using reflectors 205. In one embodiment, backlight module 200 includes a single point light source 250, which emits light 250 of a white color. In another embodiment, backlight module 200 includes four point light sources 250 disposed proximate the four corners of a square/rectangular light guide plate, the light sources 250 respectfully emitting light of, for example, red, green, blue, and white (or infrared) colors.

In one embodiment, ISP 100 includes transparent areas such that the uniform planar light source generated from backlight module 200 can penetrate therethrough and hit a document 10 placed on the top surface of the light guide plate. The planar light source is then reflected from document 10 along a second direction 30. The reflected light optically carries information attached to document 10. Such information carried by the reflected light can be detected by photosensitive pixels formed on the ISP 100, as further detailed below.

FIG. 2 illustrates a plane view of an image sensor panel (ISP) 100, in accordance with an embodiment of the present disclosure. ISP 100 includes a transparent substrate 110, an array of sensor pixels 120, and a plurality of column conductive lines (columns) 130 and row conductive lines (rows) 140 electrically coupled with the sensor pixels 120. Sensor pixels 120 may be formed proximate intersections of columns 130 and rows 140. In certain embodiments, sensor pixels 120 can be arranged on a first region of substrate 110 to form a square lattice structure, a rectangular lattice structure, a triangular lattice structure, a hexagonal lattice structure, and the like. Each of sensor pixels 120 can be configured to have, for example, a circular shape, an oval shape, a square shape, a rectangular shape having rounded corners, or any other suitable shapes. In one embodiment, the first region of substrate 110 is rendered optically opaque due to the presence of sensor pixels 120. In one embodiment, ISP 100 is devoid of light emitting elements and optically transparent at non-sensor pixel regions (i.e., other than the first region).

In the embodiment of a square lattice structure, each sensor pixel may have a sensor pixel size S (e.g., a width or diameter, depending on the pixel shape, of about 10-40 um) and two neighboring sensor pixels may be separated by a pixel separation distance P. Pixel separation distance P may be about 1.5 to 5 times of pixel size S. For example, pixel size S may be 20 um, while pixel separation may be 30 um (P=1.5 S), 40 um (P=2 S), or 50 um (P=2.5 S). The sensor pixels 120 are separated so as to leave transparent regions 150 (i.e., the non-sensor pixel regions) to allow at least a portion of the surface light source from backlight module 200 to penetrate therethrough.

FIG. 3 illustrates a sectional view of a sensor pixel 120 of the image sensor panel 100 as illustrated in FIG. 2. Referring to FIG. 3, sensor pixel 120 may be formed on a TFT backplane 121 and include a bottom electrode 122 on TFT backplane 121, an interlayer 123 on bottom electrode 122, a photosensitive layer 124 on interlayer 123, a top electrode 125 on photosensitive layer 124, and a protective layer 126 on top electrode 125. Photosensitive layer 124 may comprise semiconductor materials, e.g., amorphous silicon (a-Si), low temperature polysilicon (LTPS), metal oxide (ZnO, IGZO, etc.), and the like, which form a PIN structure. Alternatively, photosensitive layer 124 may comprise organic photon sensitive materials. Interlayer 123 is optional and may comprise PEDOT:PSS. Protective layer 126 is optional and may comprise a transparent laminating material or alternatively a non-transparent (opaque) resin material so as to form a light block.

Referring to FIGS. 1 through 3, in one embodiment, a light source (e.g., a surface light source from backlight module 200) can emit along a first direction 20 to an information bearing substrate (IBS) 10 bypassing sensor pixels 120 and through non-sensor pixel regions 150. The light source is then reflected from IBS 10, carrying information from IBS 10 and entering into sensor pixels 120 along a second direction 30. In one embodiment, darker markings on IBS 10 reflect less light (lower intensity), while brighter markings on IBS 10 reflect more light (higher intensity). In response to the reflected light, photosensitive layer 124 detects the information carried by the reflected light (e.g., intensity of the reflected light) and generates electrons, thereby forming a photo current that flows vertically and is detected or read through column 130 and row 140. In this embodiment, top electrode 125 and/or protective layer 126 may comprise an optically non-transparent material, thereby acting as a light block, while TFT layer 121 and bottom electrode 122 may comprise optically transparent materials.

It is appreciated that, in an alternative embodiment, first direction 20 of light source and second direction 30 of reflected light may be opposite to those illustrated in FIG. 3. As such, in the alternative embodiment, top electrode 125 and protective layer 126 may comprise optically transparent materials, while bottom electrode 122 and/or TFT layer 121 may comprise an optically non-transparent (or opaque) material, thereby acting as a light block.

FIGS. 4A through 4D illustrate a layered structure of a sensor pixel 120, read by a single thin film transistor (TFT) 121, in accordance with an embodiment of the present disclosure. FIG. 4A illustrates the layered structure of a TFT backplane, before formation of a photosensitive layer 124. FIG. 4B illustrates a section view of the layered structure taken from line B-B of FIG. 4A. FIG. 4C illustrates the layered structure, after formation of photosensitive layer 124 on the TFT backplane. FIG. 4D illustrates a section view of the layered structure taken from line D-D of FIG. 4D.

Referring to FIGS. 4A and 4B, sensor pixel 120 is formed on a transparent substrate 110 (made of, for example, glass or plastic). A gate electrode 121G is formed on substrate 110, and a first transparent dielectric layer 112 (made of, for example, $SiO_2$) is formed on gate electrode 121G covering substrate 110. A channel layer 121C is formed and patterned on dielectric layer 112 and at a position that is aligned with gate electrode 121G. Channel layer 121C comprises a semiconductor material of, e.g., amorphous silicon (s-Si), low temperature polysilicon (LTPS), metal oxide (ZnO, IGZO, etc.), and the like. Source/drain electrodes 121SD and 121DS are formed on dielectric layer 112. Source/drain electrodes 121SD and 121DS are separated by channel layer 121C, and electrically coupled to two opposing sides of channel layer 121C. A second transparent dielectric layer 114 is formed on channel layer 121C and source/drain electrodes 121SD and 121DS. Gate electrode 121G, channel layer 121C, source/drain electrodes 121SD and 121DS constitute TFT 121.

A sensor pixel electrode 122 is formed on second transparent dielectric layer 114 and is electrically coupled to source/drain electrode 121SD through a via hole 122V formed in dielectric layer 114. In this embodiment, gate electrode 121G is electrically coupled to row line 140, while source/drain electrode 121DS is electrically coupled to column line 130. In one embodiment, via hole 122V may be formed by selectively etching dielectric layer 114 to expose a portion of source/drain electrode 121SD prior to the formation of sensor pixel electrode 122. Sensor pixel electrode 122 may be formed by depositing a metallic material on dielectric layer 114, filling via hole 122V, and subsequently patterned into, for example, a square shape having round corners, as shown in FIG. 4A. Prior to deposition of the metallic material, a third transparent dielectric layer 116 may be formed and etched to define a shape of the pixel electrode 122. Upon deposition of the metallic material, dielectric layer 116 and sensor pixel electrode 122 may be planarized for further processing.

Referring to FIGS. 4C and 4D, a photosensitive layer 124 is formed on pixel electrode 122, and a common electrode 125 is formed on photosensitive layer 124. Common electrode 125 may be coupled to a common ground (i.e., 0 Volt). In one embodiment, photosensitive layer 124 may include a first semiconductor layer (having either n- or p-type conductivity) deposited on pixel electrode 122, an intrinsic semiconductor layer deposited on the first semiconductor layer, and a second semiconductor layer (having a conductivity type opposite to that of the first semiconductor layer) deposited on the intrinsic semiconductor layer. The three layers form a photodiode having a PIN structure. As such, in response to impinging light, the PIN structure can generate photocurrent that flows vertically. It is appreciated that the intrinsic semiconductor layer may not be necessary in certain applications. In this embodiment, the photosensitive layer 124 is etched and patterned in a photolithography process, so as to form an array of sensor pixels 120 as shown in FIG. 2.

In other embodiments, the photosensitive layer 124 may be a dual-band sensor, having two PIN structures (e.g., a vertical structure of p-i-n-i-p or n-i-p-i-n, or a horizontal structure of p-i-n and p-i-n), one PIN structure being sensitive to, for example, visible light (having a wavelength ranging between 400 nm and 700 nm), while the other PIN structure being sensitive to, for example, infrared light (having a wavelength ranging between 700 nm and 1 mm). The two PIN structures can be arranged vertically into a single stacked structure or horizontally into two stacked structures neighboring each other.

In one embodiment, the photosensitive layer 124 may comprise silicon, germanium, selenium, SiGe, GaAs, InGaAs, SiC, GaN, CuO, CuSe, CuTe, CdS, CdSe, CdTe, InSb, CuInGaS, CuInGaSe, CuInGaTe, TeGeHg, CuInSe, CuInS, CuInTe, HgCdTe, or combinations thereof in an amorphous, crystalline, or polycrystalline form. For a sensor pixel array that is sensitive to visible light, amorphous silicon (a-Si) p-i-n stack can be formed directly using a PECVD process. Additionally or alternatively, other sensing elements can be formed with a sensing function layer sandwiched between the top and bottom electrodes. For example, a thermal image array can be formed with a thermo-electric layer that is sensitive to infrared light. In other embodiments, a scintillator film sensitive to X-ray can be formed in place of the p-i-n structure. See, for example, WO 2014/093244, published on Jun. 19, 2014, which is incorporated herein by reference.

In an alternative embodiment, the photosensitive layer 124 may comprises a mixture of a p-type polymeric organic semiconductor (e.g., poly (3-hexylthiophene) or poly (3-hexylthiophene-2, 5-diyl), also known as P3HT) and an n-type polymeric organic semiconductors (e.g., [6,6]-phenyl-methyl-butanoate C6i, also known as PCBs). See, for example, WO/2014/060693, published on Apr. 24, 2014, which is incorporated herein by reference.

FIGS. 5A and 5B respectively illustrate a sectional view of an image sensor panel 100 in combination with a liquid crystal display (LCD) module 400 and an organic light emitting diode (OLED) display module 500, in accordance with embodiments of the present disclosure. Referring to FIG. 5A, LCD module 400 includes a backlight module 410 configured to emit a planar light source 20 of, for example, white color. Backlight module 410 may additionally include a first polarizer so as to make planar light source 20 linearly polarized along a first direction. LCD module 400 further includes a TFT backplane 420 on backlight module 410, a liquid crystal material 430 on TFT backplane 420, and a color filter layer 440 on liquid crystal material 430. The liquid crystal material 430 is enclosed between TFT backplane 420 and color filter layer 440. TFT backplane 420 includes display pixel electrodes to control the rotation orientation of liquid crystal material 430 so as to rotate the polarization direction of planar light source 20 at different pixel locations. Color filter 440 includes an array of color pixels (e.g., red, green, and blue) separated by a black matrix, each color pixel corresponding to a display pixel electrode of TFT backplane 420, so as to generate colored output for LCD module 400. Color filter 400 may additionally include a second polarizer having a polarization direction perpendicular to that of the first polarizer of backlight module 410.

As shown in FIG. 5A, an image sensor panel (ISP) 100 is disposed on color filter 440 and is enclosed in a housing 300 together with LCD module 400. It is appreciated that, in certain embodiments, ISP 100 can be formed and integrated with color filter 440. An upper surface of ISP 100 is optically exposed to the exterior of housing 300 so as to allow light source 20 to penetrate therethrough. As discussed above, ISP 100 includes a plurality of photosensitive pixels separated from each other to leave optically transparent regions. In one embodiment, the photosensitive pixels of ISP 100 are aligned with the black matrix of color filter 440 so as not to interfere with the display quality.

Although, in certain embodiments, ISP 100 of the present disclosure can be used in touch control applications, display module 400 may still include an optically transparent capacitive touch panel (not shown). The capacitive touch panel may be disposed on display module 400 and between ISP 100 and color filter 440. Alternatively, the capacitive touch panel may be disposed on ISP 100 and can be in contact with IBS 10 when placed thereon.

Referring to FIG. 5B, OLED display module 500 includes a TFT backplane 510 having a plurality of light emitting pixels formed thereon and a cover glass 520 on TFT backplane 510. As shown in FIG. 5B, an image sensor panel (ISP) 100 is disposed on cover glass 520 and is enclosed in a housing 300 together with OLED display module 500. It is appreciated that, in certain embodiments, ISP 100 can be formed on and integrated with cover glass 520. An upper surface of ISP 100 is optically exposed to the exterior of housing 300 so as to allow light source 20 to penetrate therethrough. As discussed above, ISP 100 includes a plurality of photosensitive pixels separated from each other to leave transparent regions. In one embodiment, the transparent regions (i.e., the area between photosensitive pixels) of ISP 100 are aligned with light emitting pixels of OLED display module, so as maintain display quality substantially unaffected.

In some embodiments, display module 500 may additionally include an optically transparent capacitive touch panel (not shown). The capacitive touch panel may be disposed on display module 500 and between ISP 100 and cover glass 520. Alternatively, the capacitive touch panel may be disposed on ISP 100 and can be in contact with IBS 10 when placed thereon.

Referring to both FIGS. 5A and 5B, in operation, an information bearing substrate (IBS) 10, such as a document, can be placed on ISP 100 with the information bearing surface contacting an upper surface of ISP 100, such that planar light source 20 can be reflected from IBS 10 to form reflected light 30. Sensor pixels of ISP 100 can then detect reflected light 30 from IBS 10, thereby capturing textual or graphical information attached to the information bearing surface of IBS 10.

Figure 6:
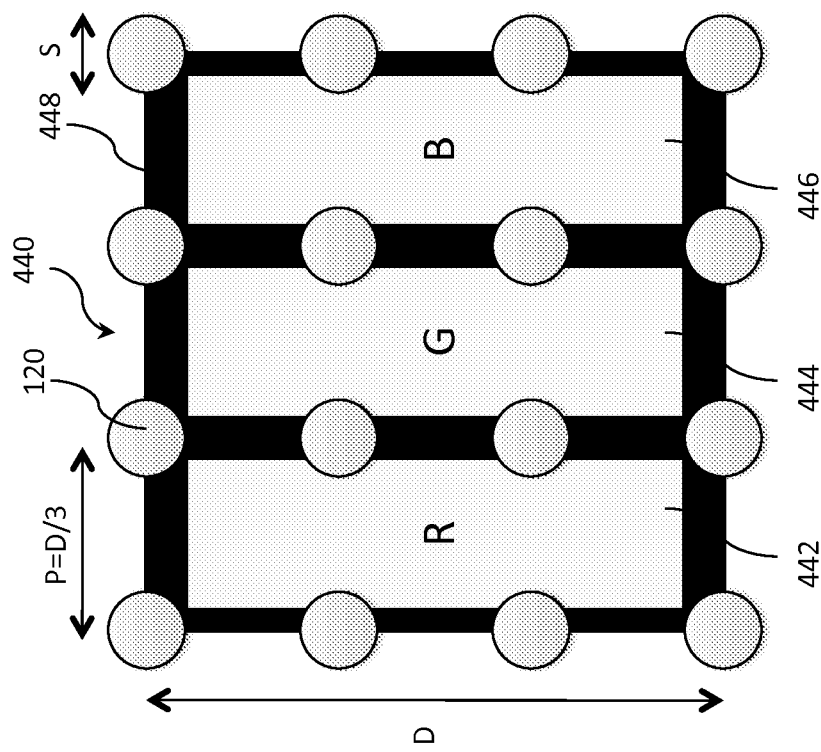
FIG. 6 illustrates a plane view of a sensor pixel array aligned with a black matrix of a display module, in accordance with an embodiment of the present disclosure.
Figure 8:
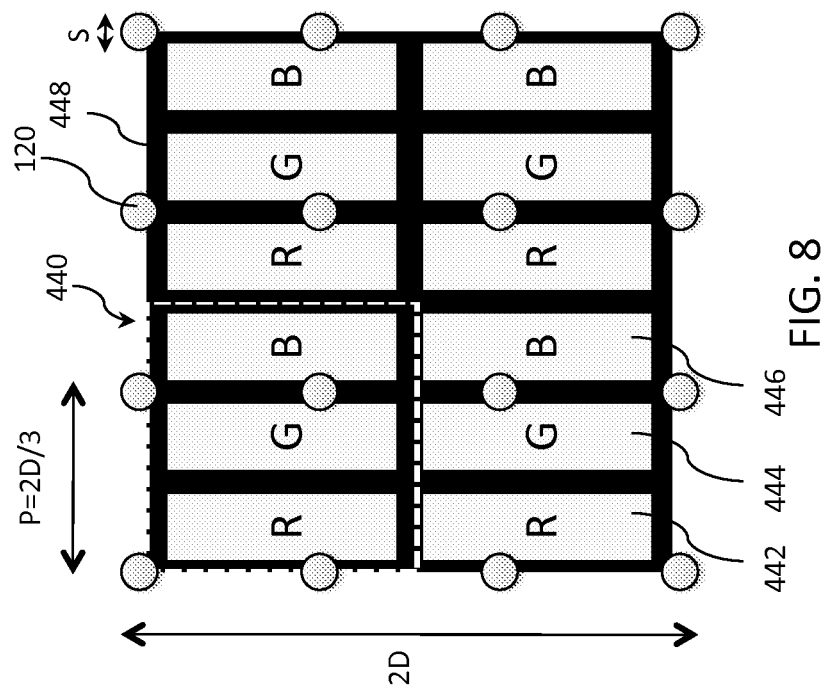
FIG. 8 illustrates a plane view of a sensor pixel array aligned with a black matrix of a display module, in accordance with an embodiment of the present disclosure.

FIG. 6 illustrates a plane view of a sensor pixel array aligned with a black matrix of a display module, in accordance with an embodiment of the present disclosure. FIG. 7 illustrates a plane view of a sensor pixel array slightly misaligned with a black matrix of a display module, in accordance with an embodiment of the present disclosure. FIG. 8 illustrates a plane view of a sensor pixel array aligned with a black matrix of a display module, in accordance with an embodiment of the present disclosure.

Referring to FIGS. 6 through 8, different array configurations of sensor pixels 120 can be used in combination with color display pixels 440 to capture optical images. In one embodiment, a color display pixel 440 includes a red sub-pixel 442, a green sub-pixel 444, and a blue sub-pixel 446. Color display pixel 440 may have a pixel size D (e.g., length or width) and a sensor pixel 120 may have a sensor pixel size S (e.g., diameter). As shown in FIG. 6, in one embodiment, sensor pixels 120 are separated with each other by about D/3. As shown in FIG. 7, in another embodiment, sensor pixels 120 are separated with each other by about D/2. As shown in FIG. 8, in still another embodiment, sensor pixels 120 are separated with each other by about 2D/3. As a result, the image sensor panel of the present disclosure can have a sensing resolution (monochrome) that is about double or triple of the display resolution. It is appreciated that color filters can be formed on sensor pixels 120 so as to capture colorful images using the image sensor panel of the present disclosure.

Referring to FIG. 6, sub-pixels 442, 444, and 446 are separated with each other by a black matrix 448. In this embodiment, all sensor pixels 120 are aligned with black matrix 448. Although, in certain cases, sensor pixel size S may be slightly greater than a width of black matrix 448 and thus slightly overlap with display pixels 440, the display quality is substantially unaffected, because at least 90% of the display's light emitting area is not obstructed by sensor pixels 120.

Referring to FIG. 7, some of sensor pixels 120 are misaligned with black matrix 448. For example, as shown in FIG. 7, one of sensor pixels 120 overlaps with green sub-pixel 444. Although the display's light emitting area is somewhat obstructed by some sensor pixels 120, the display quality (e.g., homogeneity) may still be substantially unaffected, because sensor pixel size S may be much smaller than display pixel size D. Further, the display quality can be adjusted and fine tuned by calibrating the emission intension of individual display pixels 440 after an image sensor panel is disposed and adhered onto a display module.

Referring to FIG. 8, sub-pixels 442, 444, and 446 are separated with each other by a black matrix 448 and all sensor pixels 120 are aligned with black matrix 448. In this embodiment, sensor resolution is about 1.5 times of the display resolution.

Figure 9:
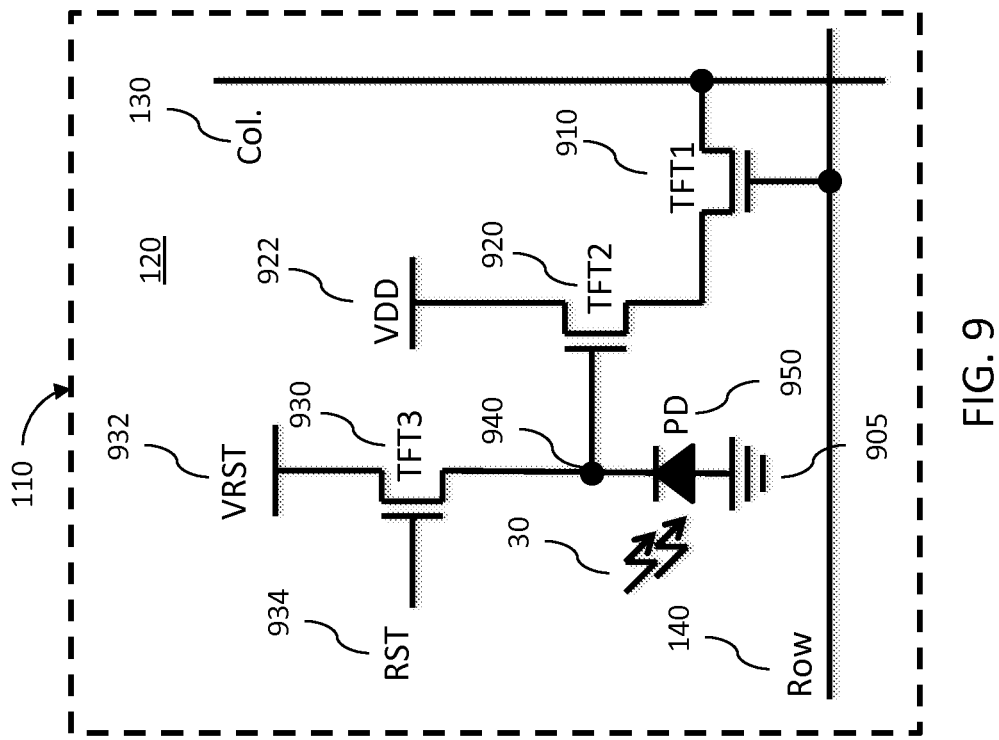
FIG. 9 illustrates a schematic circuit diagram of a sensor pixel, read by three thin film transistors (TFTs), in accordance with an embodiment of the present disclosure.

FIG. 9 illustrates a schematic circuit of a sensor pixel 120, read by three thin film transistors (TFTs), in accordance with an embodiment of the present disclosure. In this embodiment, sensor pixel 120 includes a first TFT 910, a second TFT 920, a third TFT 930, and a thin film photodiode 950. First TFT 910, second TFT 920, and third TFT 930 are formed on a glass substrate 110, while thin film photodiode 950 is stacked above first, second, and third TFTs 910, 920, and 930. As shown in FIG. 9, the gate of first TFT 910 is coupled to row 140. The drain of first TFT 910 is coupled to column 130. The source of first TFT 910 is coupled to the drain of second TFT 920. The source of second TFT 920 is coupled to a voltage source VDD or 922. The gate of second TFT 920 is coupled to a node 940. The gate of third TFT 930 is coupled to a reset signal line 934. The source of third TFT 930 is coupled to a reset voltage VRST or 932. The drain of third TFT 930 is coupled with node 940. The cathode of photodiode 950 is coupled to node 940. The anode of photodiode 950 is coupled to a common ground 905.

Third TFT 930 acts as a switch to reset photodiode 950. When third TFT 930 is turned on by an ON signal sent from reset signal line 934, photodiode 950 is connected to the reset voltage 932 (or power supply), thereby clearing charge accumulated on node 940. Second TFT 920 acts as a buffer (e.g., a source follower) and an amplifier, which allows pixel voltage of photodiode 950 to be observed without removing the accumulated charge. First TFT 910 acts as a switch to select one sensor pixel from an array of sensor pixels coupled with columns 130 and rows 140, so as to be read the selected sensor pixel. When first TFT 910 is turned on in response to an ON signal from row 140, information corresponding to the pixel voltage of photodiode 950 can be measured through column 130. In one embodiment, voltage source VDD may be tied to the reset voltage 932 (or power supply) of third TFT 930.

FIGS. 10A through 10D illustrate a layered structure of sensor pixel 120 shown in FIG. 9. It is appreciated that, unless otherwise stated herein, the electrically conductive lines (e.g., signal lines, metallic interconnects, etc.) discussed in the present disclosure have a line width of at least 5 um and a line separation of at least 3 um. Referring to FIGS. 10A through 10D together with FIG. 9, a gate electrode 911 of first TFT 910, a gate electrode 921 of second TFT 920, and a gate electrode 931 of third TFT 930 are formed on different locations of substrate 110.

Referring to FIG. 10A, reset signal line 934 is formed on substrate 110, linearly traversing along a rear portion of sensor pixel 120, and is electrically coupled to gate electrode 931 through interconnect 936. Row conductive line 140 is formed on substrate 110, linearly traversing a front portion of sensor pixel 120, and is electrically coupled to gate electrode 911 through a metallic interconnection 916. A metallic interconnection 926 is formed on substrate 110 and is electrically coupled to gate electrode 921.

Referring to FIGS. 10A and 10C, a first dielectric layer 960 having a thickness of about 0.2 um to 0.4 um is formed over gate electrodes 911, 921, and 931, reset signal line 934, row conductive line 140, and metallic interconnections 916, 926, and 936. First dielectric layer 960 includes a via hole 927 formed by selective etching, so as to expose a portion of metallic interconnection 926 at a distal end from gate electrode 921. In one embodiment, first dielectric layer 960 comprises a low-k dielectric material and may be planarized for further processing.

Referring to FIGS. 10B and 10D, a channel layer 904 is formed on first dielectric layer 960 above both gate electrodes 911 and 921, and a channel layer 934 is formed on first dielectric layer 960 above gate electrode 931. In this embodiment, a single channel layer 904 is shared between gate electrodes 911 and 921 for both first and second TFTs 910 and 920. In other embodiments, instead of a single channel layer 904, two separate channel layers may be formed on first dielectric layer 960 respectively above and aligned with gate electrodes 911 and 921.

Referring to FIGS. 10B, 10C, and 10D, column conductive line 130 is formed on first dielectric layer 960, linearly traversing a right hand portion of sensor pixel 120, and is electrically coupled to a right side of channel layer 904 (or first TFT 910) through source/drain electrode 913. Voltage source line 922 is formed on first dielectric layer 960, linearly traversing a central portion of sensor pixel 120, and is electrically coupled to a left side of channel layer 904 (or second TFT 920) through source/drain electrode 925. Reset voltage line 932 is formed on first dielectric layer 960, linearly traversing a left hand portion of sensor pixel 120, and is electrically coupled to a left side of channel layer 934 (or third TFT 930) through source/drain electrode 935. A metallic interconnection (or source/drain electrode) 933 is formed on first dielectric layer 960 filling via hole 927, and is electrically coupled between a right side of channel layer 934 and gate electrode 921 through metallic interconnection 926.

In one embodiment, when channel layer 904 includes a single layer which comprises a semiconductor material of relatively low electrical mobility (e.g., a-Si having an electron mobility of about 0.5~1.0 cm$^2$/(V·s) and IGZO having an electron mobility of about 1.0~20.0 cm$^2$/V·s), a metallic interconnection 905 is formed on channel layer 904 and between gate electrodes 911 and 921, so as to constitute source/drain electrodes 923 and 915, and to form two distinctive channel regions respectfully for first and second TFTs 910 and 920. In another embodiment, when channel layer 904 includes a single layer which comprises a semiconductor material of relatively high electrical mobility (e.g., LTPS having an electric mobility of at least 100.0 cm$^2$/V·s), metallic interconnection 905 is not necessary for first and second TFTs 910 and 920. In an alternative embodiment, when channel layer 904 includes two separate and mutually insulating channel layers, a metallic interconnection 905 is formed on first dielectric layer 960 and over sides of the two separate channel layers, so as to constitute source/drain electrodes 923 and 915.

Referring to FIGS. 10B and 10D, a second dielectric layer 970 is formed on source/drain electrodes 913, 915, 923, 925, 933, and 935, and over channel layers 904 and 934. In one embodiment, second dielectric layer 970 includes a via hole 942 formed by selective etching of second dielectric layer 970 and may be planarized for further processing. As shown in FIG. 10D, a sensor pixel electrode 122 is formed on second dielectric layer 970 filling via hole 942, and is electrically coupled to third TFT 930 through source/drain electrode 933. In one embodiment, sensor pixel electrode 122 may have a surface area substantially equivalent to that of a collection of first, second, and third TFTs 910, 920, and 930, so as to form a vertically stacked structure. In one embodiment, second dielectric layer 970 has a thickness ranging between 0.3 um and 2.0 um or at least 0.3 um, so as to prevent or at least reduce undesirable interferences to the underlying TFTs 910, 920, and 930 due to, for example, a parasitic capacitance effect.

FIG. 11 illustrates a perspective view of a laptop computer 1100 comprising a bidirectional display 1110 (including a display panel and an image sensor panel disposed on the display panel) in accordance with an embodiment of the present disclosure. Bidirectional display 1110 can be used to capture graphical information on an information bearing substrate (IBS) 1120. As shown in FIG. 11, a user can use one hand to hold IBS 1120 with the information bearing surface (i.e., the surface having, for example, texts or graphics attached thereto) facing a screen surface of bidirectional display 1110. The user can use another hand to trigger a scan event by pressing a button 1130 (e.g., a key on the keyboard) of laptop computer 1100. In an alternative embodiment, the scan event may be automatically triggered once IBS 1120 contacts and properly conforms to the screen surface of bidirectional display 1110.

The information attached to IBS 1120 can be optically captured by bidirectional display 1110 in response to the triggered scan event. In one embodiment, laptop computer 1100 may additional include a mechanical switch at a side of the keyboard portion of laptop computer 1100 to turn on/off of the electrical power for the image sensor panel of bidirectional display 1110, so as to reduce power consumption and enhance user privacy. It is appreciated that the mechanical switch may be implemented as a soft/virtual button and/or a function key or a combination of function keys on the keyboard.

FIG. 12 illustrates a perspective view of a smartphone device 1200 comprising a bidirectional display 1210 (including a display panel and an image sensor panel disposed on the display panel) in accordance with an embodiment of the present disclosure. Bidirectional display 1210 can be used to optically capture an image copy of an information bearing substrate 1220. Referring to FIG. 12, smartphone device 1200 includes bidirectional display 1210, a mini camera 1202 proximate a top side of smartphone device 1200, a start button 1240 proximate a bottom side of smartphone device 1200, and a power/lock button 1260 at a side of smartphone device 1200. Smartphone device 1200 may optionally include a protective cover flap 1205 and optionally include an earphone 1250 having a control button 1230.

As shown in FIG. 12, a user can hold the IBS 1220 with the information-bearing surface facing a screen surface of bidirectional display 1210. In one embodiment, protective cover flap 1205 may include an IBS holder 1206, which can be sized to accommodate, for example, a standard business card or credit card, such that IBS 1220 can be held by protective cover flap 1205 and scanned when protective cover flap 1205 is flipped and closed onto bidirectional display 1210. Depending on design choices, the user can trigger a scan event by pressing start button 1240, pressing control button 1230 of earphone 1250, pressing power/lock button 1260, or a combination of the above. In another embodiment, a scan event may be triggered immediately after IBS 1220 contacts and properly conforms to the screen surface of bidirectional display 1210.

In yet another embodiment, smartphone device 1200 may include one or more magnetic switches (not shown) disposed at one or various positions underneath bidirectional display 1210. In this embodiment, a user may trigger a scan event by closing cover flap 1205 onto bidirectional display 1210, and approaching and aligning one or more magnets to the magnetic switches. The magnets can be embedded in cover flap 1205 or applied externally after cover flap 1205 is covered on bidirectional display 1210.

As shown in FIG. 12, IBS 1220 may have a substantially rectangular shape, but when placed on the display screen slightly rotated relative to the rectangular shape of bidirectional display 1210. Accordingly, in one embodiment, smartphone device 1200 can first detect the boundary of IBS 1220. Upon determination of the boundary of IBS 1220, which may be slightly bigger than the actual area of IBS 1220, the display panel of bidirectional display 1210 can emit a probing light only within the IBS boundary. In response to triggering of the scan event, information attached to IBS 820 can be carried by reflected light, captured by the image sensor panel of bidirectional display 1210, and converted into a digital image.

FIG. 13 illustrates a perspective view of a smartphone device 1300 comprising a bidirectional display 1310 (including a display panel and an image sensor panel disposed on the display panel). Bidirectional display 1310 can be used to detect a user's finger drawing 1320, in accordance with an embodiment of the present disclosure. Referring to FIG. 13, similar to smartphone device 1200 of FIG. 12, smartphone device 1300 includes bidirectional display 1310 and a start button 1340 proximate a bottom side of smartphone device 1320. Instead of emitting a probing light pulse, in a drawing detection mode, the image sensor panel of bidirectional display 1310 can passively detect the user's contacts/drawings using the image sensor panel. Alternatively, the display panel of bidirectional display 1310 can actively emit a constant intensity probing light during a time period that bidirectional display 1310 is switched to the drawing detection mode. In one embodiment, when an object (such as a finger tip or stylus tip) is placed on or proximate bidirectional display 1310, it can sequentially sense the locations and/or directions of the object forming drawing 1320 on bidirectional display 1310, thereby detecting a shape or pattern of drawing 1320. In certain embodiments, the image sensor panel of bidirectional display 1310 can be used in place of the existing capacitive touch sensitive panel.

Figure 14:
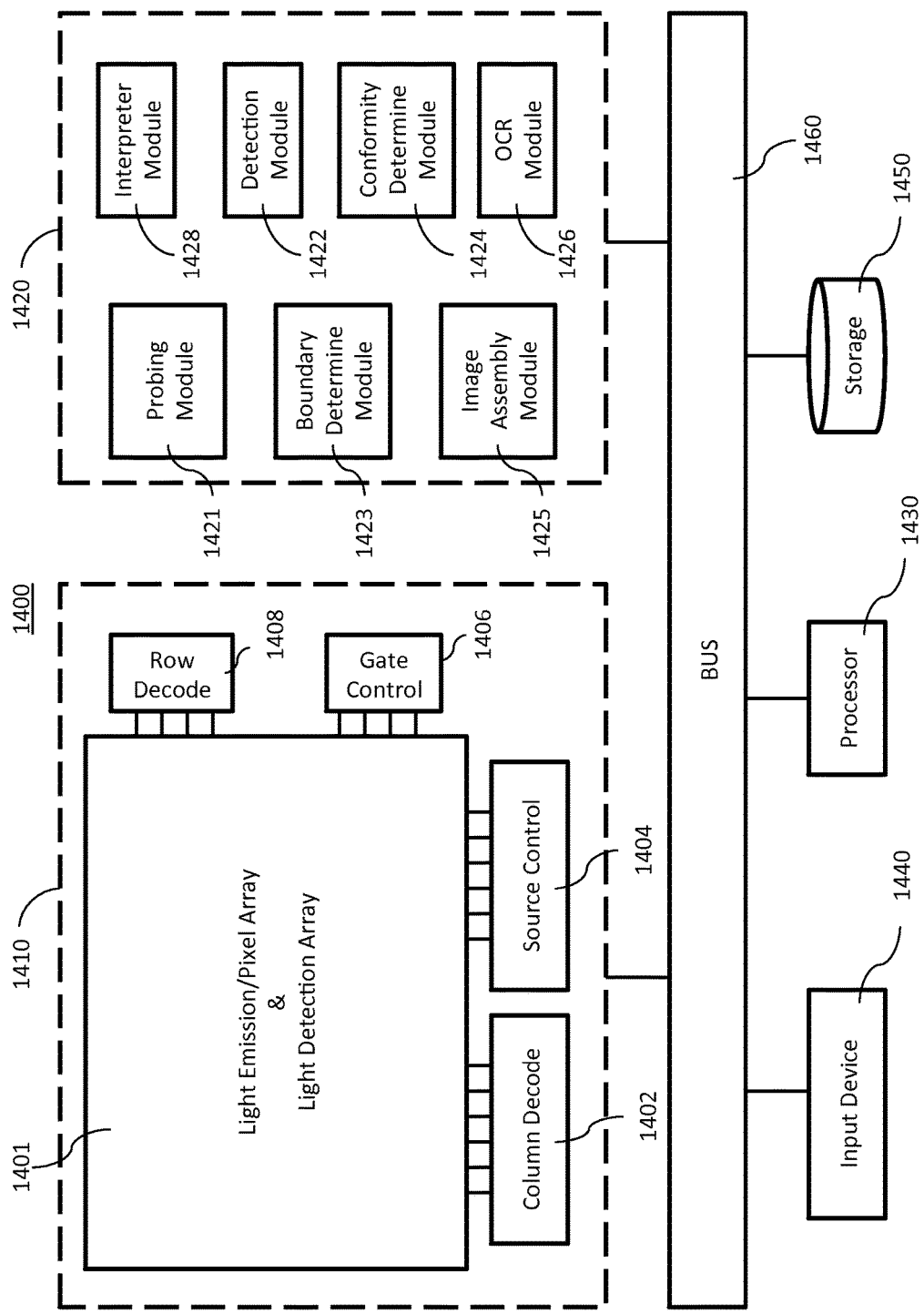
FIG. 14 illustrates a block diagram of an electronic device in accordance with an embodiment of the present disclosure.

FIG. 14 illustrates a block diagram of an electronic device 1400 in accordance with an embodiment of the present disclosure. As shown in FIG. 14, electronic device 1400 includes a bidirectional display 1410, a memory 1420, a processor 1430, an input device 1440, and a storage device 1450, which are electrically coupled with each other through a system bus 1460. Bidirectional display 1400 includes a display panel 400 or 500, and an image sensor panel 100 disposed on display panel 400 or 500, examples of which are illustrated in FIGS. 5A and 5B. In addition, bidirectional display 1410 includes a source control circuit 1404, a gate control circuit 1406, a column decode circuit 1402, and a row decode circuit 1408. Source control circuit 1404 and gate control circuit 1406 are electrically coupled to display panel 400 or 500 through source lines and gate lines, so as to control emission of the light emitting elements of display panel 400 or 500. Column decode circuit 1402 and row decode circuit 1408 are electrically coupled to sensor pixels of image sensor panel 100 through column decode lines and row decode lines, so as to control light detection of the sensor pixels of image sensor panel 100.

In one embodiment, source control circuit 1404, gate control circuit 1406, column decode circuit 1402, and row decode circuit 1408 are respectively implemented in different integrated circuit (IC) chips. It is appreciated, however, that some or all of source control circuit 1404, gate control circuit 1406, column decode circuit 1402, and row decode circuit 1408 may be integrated in a single IC chip. Further, source control circuit 1404 and gate control circuit 1406 may be implemented as one IC chip, while column decode circuit 1402 and row decode circuit 1408 may be implemented as another IC chip.

In order to capture images using bidirectional display 1410, a computer program product may be stored in storage device 1450 (e.g., hard drive, non-volatile solid state memory drive, and the like) and loaded to memory 1420 (e.g., random access memory (RAM) or other volatile memory) of electronic device 1400 for execution by processor 1430. In one embodiment, all or part of the computer program product may be included as add-on modules in an operating system (e.g., Linux, Android, iOS, etc.) for the electronic device 1400. In another embodiment, the computer program product may be a standalone computer software application (e.g., a mobile app or a software application package) executable on electronic device 1400 using resources of the operating system. In one embodiment, the computer program product includes a probing module 1421, a light detection module 1422, and an image assembly module 1425. In one embodiment, the computer program product additionally includes one or more of a boundary determination module 1423, a conformity determination module 1424, and an optical character recognition (OCR) module 1426. In one embodiment, the computer program product can further include an interpreter module 1428, such as a scripting language software program configured to interpret lines of codes written in a specific scripting language and to instruct hardware of electronic device 1400 to perform the functions as provided in the lines of codes.

Probing module 1421 comprises computer instructions to control gate control circuit 1406 and source control circuit 1404, such that probing signals can be transmitted to the light emitting elements of display panel 400 or 500, in response to a scan event, thereby emitting a predetermined probing light.

Light detection module 1422 comprises computer instructions to control column decode circuit 1402 and row decode circuit 1408, such that light (e.g., reflected light from the IBS) entering the sensor pixels of image sensor panel 100 can be detected in response to a scan event. The detected raw image data may be transmitted to image assembly module 1425 for further processing.

Image assembly module 1425 comprises computer instructions to analyze the raw image data detected by light detection module 1422, and assemble or generate a digital image data file from the raw image data. In one embodiment, the digital image data file can be a pixel-based image data file of a lossy/lossless compressed format (e.g., JPG, PNG, TIFF, etc.) or a pixel-based image data file of an uncompressed format (e.g., BMP). In one embodiment, image assembly module 1425 saves the generated digital image data file into storage device 1450. The digital image data file is then ready for user access or further processing.

In one embodiment, the generated digital image data file is transmitted to or loaded by OCR module 1426 for further processing. OCR module 1426 analyzes the digital image data file and extracts textual information from the image data file. The extracted textual information can be saved into storage device 1450 as a text data file (e.g., TXT, DOC, etc.). Alternatively, the extracted textual information can be saved together with non-textual image data as a combined image/text data file (e.g., PDF).

Boundary determination module 1423 comprises computer instructions to determine the boundary of an IBS placed on an image sensor panel 100 of the present disclosure. In one embodiment, upon triggering of a scan event, boundary determination module 1423 transmits an instruction set to detection module 1422 to passively monitor an IBS. Upon placing an IBS over a screen surface of image sensor panel 100, the boundary determination module 1422 captures a temporary image for the entire screen of image sensor panel 100. Because detection module 1422 passively monitors an IBS (i.e., without emitting a probing light), a relatively darker region in the temporary image may correspond to the IBS region, while a relatively brighter region in the temporary image may correspond to the non-IBS region. It is appreciated that detection module 1422 can monitor an IBS with a white probing light being constantly emitted. In such cases, a relatively brighter region in the temporary image may correspond to the IBS region, while a relatively darker region in the temporary image may correspond to the non-IBS region.

In one embodiment, boundary determination module 1423 analyzes the temporary image and determines a boundary of the IBS in accordance with a brightness change in the temporary image. In one embodiment, prior to analyzing the temporary image, boundary determination module 1423 can adjust the temporary image by, for example, increasing contrast of the temporary image. In one embodiment, boundary determination module 1423 generates a boundary data file (comprising data points of the boundary locations) and save the boundary data file in storage device 1450. In one embodiment, the IBS may be a user's foot, and by placing the user's foot on image sensor panel 100 of the present disclosure, boundary determination module 1423 can acquire boundary data of the user's foot. The boundary data can then be further analyzed and converted to a shoe size of the user, thereby determining inventory availability of footwear for the user.

Conformity determination module 1424 comprises computer instructions to determine whether an IBS has been properly placed on a screen surface of image sensor panel 100. In one embodiment, conformity determination module 1240 monitors the sensor pixels of image sensor panel 100 and waits for an IBS. Once the sensor pixels detect that an IBS is placed on image sensor panel 100, a temporary image may be captured and transmitted to conformity determination module 1424. Conformity determination module 1424 then analyzes the temporary image and determines whether the temporary image is substantially focused. Because no converging or diverging lens is included in bidirectional display panel 1410 of the present disclosure, the temporary image can be focused or not blurred only when the IBS contacts or is disposed very close to an upper surface of image sensor panel 100. If the temporary image is substantially focused or not blurred, conformity determination module 1424 then determines that the IBS is properly placed on image sensor panel 100 and ready for the scan event.

Figure 15:
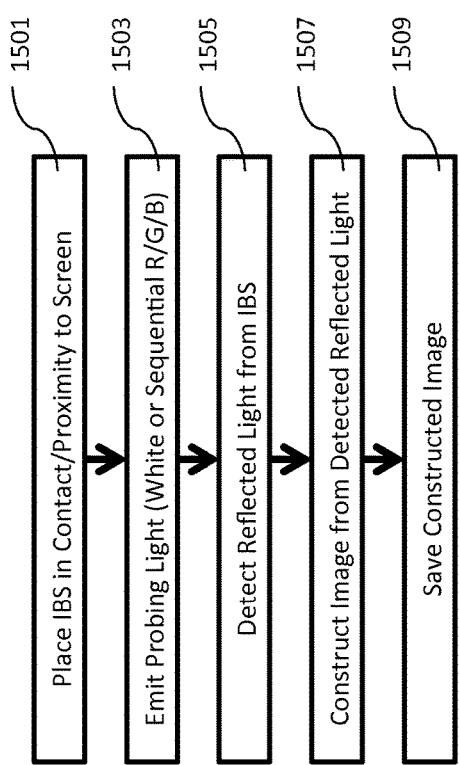
FIG. 15 illustrates a flow diagram for capturing graphical information from an information bearing substrate in accordance with an embodiment of the present disclosure.

FIG. 15 illustrates a flow diagram for capturing graphical information from an information bearing substrate in accordance with an embodiment of the present disclosure. The method of the present disclosure can capture graphical information on a monochromic (black/white or grey scale) information bearing substrate or a colored information bearing substrate.

In one embodiment, in Step 1501, an information bearing substrate (IBS) is placed in contact or in close proximity to a screen surface of a bidirectional display with an information-bearing surface facing the bidirectional display. In Step 1503, in response to a triggered scan event, a probing light of a single color is emitted from the bidirectional display panel to the IBS. In Step 1505, reflected light from the IBS is detected by an array of light detecting elements of the bidirectional display panel as raw image data. In Step 1507, a digital image data file of a predetermined format is constructed from the raw image data. In Step 1509, the digital image data file is stored in a computer memory for further processing.

In an alternative embodiment, Steps 1503 and 1505 can be repeated several times for capturing information on a colored IBS. For example, by sequentially (i) emitting red probing light and detecting reflected red light, (ii) emitting green probing light and detecting reflected green light, and (iii) emitting blue probing light and detecting reflected blue light, the bidirectional display of the present disclosure can generate colored raw image data for constructing a colored digital image data file.

Figure 16B:
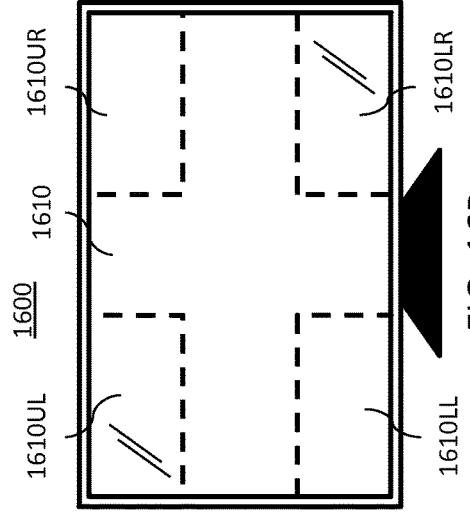
FIGS. 16A and 16B illustrate a bidirectional display device configured as a 3D image sensor, in accordance with certain embodiments of the present disclosure.
Figure 16A:
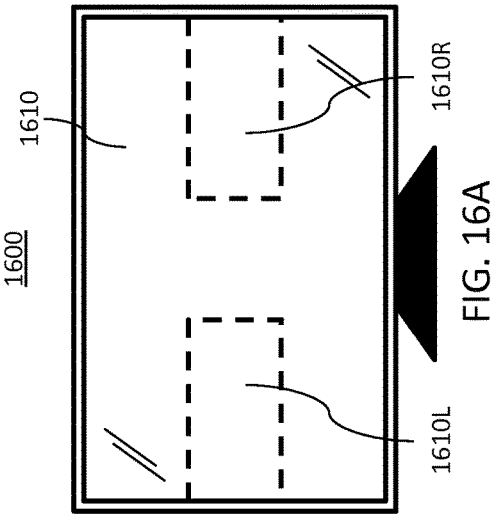

FIGS. 16A and 16B illustrate a bidirectional display 1600 configured as a 3D image sensor, in accordance with certain embodiments of the present disclosure. In one embodiment, image sensor panel 1610 of bidirectional display 1600 may be divided into sub-regions using a software program product to capture images of an object from different angles. In one embodiment, bidirectional display 1600 may be a curved display having a concave active surface, such that different sub-regions of image sensor panel 1610 can take images of an object at different angles. Such images taken from different angles of the same object may be used to reconstruct a 3D image of the object.

In one embodiment, bidirectional display 1600 may be a flat panel display having a flat display surface. For those flat panel devices, the image sensor panel of display device 1600 may additional include a micro lens array having a plurality of microlenses, each microlens being formed on an image sensor pixel, and the microlenses together forming an effective optical lens (e.g., a Fresnel lens) for certain desired optical functionality (e.g., focus, field of view, etc.) for the entire image sensor panel or sub-regions thereof.

Referring to FIG. 16A, in one embodiment, image sensor panel 1610 can be divided into two sub-regions, i.e., a left input region 1610L (effectively a first camera) and a right input region 1610R (effectively a second camera). Left and right input regions 1610L and 1610R may be a rectangular area having equal widths and lengths. In one embodiment, left and right input regions 1610L and 1610R may have an area that is a fraction of the total display area. In one embodiment, left and right input regions 1610L and 1610R may have the same aspect ratio as that of bidirectional display 1600, such that images taken by regions 1610L and 1610R can be displayed directly on display device 1600 without horizontal or vertical scaling/distortion.

Referring to FIG. 16B, in one embodiment, image sensor panel 1610 can be divided into four sub-regions, i.e., an upper-left input region 1610UL (effectively, a first camera), a lower-left input region 1610LL (effectively, a second camera), an upper-right input region 1610UR (effectively, a third camera), and a lower-right input region 1610LR (effectively, a fourth camera). Similar to input regions 1610L and 1610R shown in FIG. 16A, input regions 1610UL, 1610LL, 1610UR, and 1610LR may be a rectangular area having equal widths and lengths (i.e., equal area). In one embodiment, input regions 1610UL, 1610LL, 1610UR, 1610LR may have an area that is a fraction of the total display area of bidirectional display 1600. In one embodiment, input regions 1610UL, 1610LL, 1610UR, and 1610LR may have the same aspect ratio as that of bidirectional display 1600, such that images taken by input regions 1610UL, 1610LL, 1610UR, and 1610LR can be displayed directly on display device 1600 without horizontal or vertical scaling/distortion. Although two kinds of sub-region division are shown and described, it is appreciated that other types of sub-region division are possible without departing from the spirit and scope of the present disclosure.

The bidirectional display of the present disclosure can be used in various contexts. Below are several of such exemplary usage cases. It should be appreciated that the bidirectional display of the present disclosure can be used in various other contexts without departing from the spirit and scope of the present disclosure.

EXAMPLE ONE

Credit Card

In this example, a consumer's credit card is an IBS. Before completion of an online purchase, for example, a consumer is usually prompted to enter credit card information through an electronic commerce website or a mobile app. The required credit card information includes one or more of the credit card number (e.g., 16 digits), the expiration month/year, and the account holder's first and last names appearing on one side of the credit card, and the security code (3 or 4 digits) appearing on the other side of the credit card.

With the bidirectional display of the present disclosure, an electronic commerce website or mobile app can employ a graphic user interface on the display panel to capture credit card information directly from the front and back surfaces of the consumer's credit card. As such, the consumer does not need to manually enter the credit card information at the conclusion of the online purchase. Moreover, the bidirectional display of the present disclosure can eliminate the need of a magnetic stripe reader for credit card transactions.

In one embodiment, the graphic user interface on a bidirectional display includes a first rectangular area, which may have a physical area comparable to or slightly greater than the surface dimension of a standard credit card. The graphic user interface can then instruct the consumer to place his/her credit card on the bidirectional display and within the boundary of the first rectangular area, with the front or back surfaces of the credit card facing the bidirectional display. A scan event can then be triggered such that the electronic commerce website or mobile app can capture an image of the front or back surfaces of the credit card.

In one embodiment, the captured image may be analyzed using an OCR module to acquire textual credit card information from the captured image. The textual credit card information may include credit card number, account holder name, expiration month/year, security code, etc. Thereafter, monetary transaction for the online purchase can be completed using the acquired credit card information. In one embodiment, the captured information can additional include an image of the consumer's hand-written signature or an image of the laser sticker on a side of the credit card, thereby enhancing the transaction security in electronic commerce.

EXAMPLE TWO

Footwear Size Measurement

In this example, a consumer's foot is an IBS. Online purchase of attires and fashion accessories has become common practice for consumers with Internet access. When ordering, for example, footwear (especially children shoes) in an online purchase, it is often difficult to select the correct shoe size for the desired footwear style. Oftentimes, the shoe size numbering systems are inconsistent among different shoe makers/vendors, especially when they are based in different countries. That is, the same shoe size number of two shoe makers/vendors may correspond to two totally different actual physical sizes. Accordingly, a consumer often orders footwear of a wrong size and have to spend extra time and effort to return/exchange for a correct size.

With the bidirectional display of the present disclosure, real size of an object can be accurately measured. For example, an electronic commerce website or mobile app can employ a graphic user interface on the bidirectional display and acquire foot size information through the graphic user interface. In one embodiment, the graphic user interface prompts the consumer to place a bare foot (such as a baby foot) on a bidirectional display. In an alternative embodiment, the consumer can first draw a foot print on a piece of paper by tracing an actual foot thereon, and then place the foot print paper on the bidirectional display for shoe size determination. A scan event can then be triggered such that foot print information can be captured directly from the bidirectional display. Thereafter, the electronic commerce website or mobile app can analyze the foot print information and determine a foot size, thereby determining a correct shoe size number for the desired footwear. Although the foot size determination may not be completely accurate, with the assistance of the bidirectional display of the present disclosure, the probability of ordering wrong sized footwear can be largely reduced.

EXAMPLE THREE

Optical Touch

When a user's finger tip contacts or touches a screen surface of a bidirectional display, the soft and flexible finger tip become flattened and shows a circular/elliptical shape (or a touch shape) on the display screen. The photosensitive pixel array can "see" the touch shape and trigger a TOUCH_DOWN event in the electronic device of the present disclosure. When the finger leaves the screen surface of the bidirectional display, it triggers a TOUCH_UP event in the electronic device of the present disclosure. For example, one sequence of TOUCH_DOWN and TOUCH_UP events within a pre-determined time period constitutes a SINGLE_CLICK event. For example, two sequential TOUCH_DOWN and TOUCH_UP events within a pre-determined time period constitutes a DOUBLE_CLICK event. When the finger touches the screen surface of the bidirectional display and traverses on the screen surface, it triggers a DRAWING event, and the electronic device can then detect the drawing shape as an input.

EXAMPLE FOUR

Fingerprint and Other Biometrics

A smartphone device having a bidirectional display (including a display module and an image sensor panel) can be used to detect a user's fingerprint and/or other biometrics. A portion (e.g., a square/rectangular area) of the bidirectional display can be used to optically detect a fingerprint, while another portion/area of the bidirectional display can show the detected result in real time. The detected fingerprint can be compared with an existing finger print data stored in an electronic device to control access of the electronic device.

EXAMPLE FIVE

Pulse Oximeter

A smartphone device having a bidirectional display (including a display panel and an image sensor panel) can be used to detect pulse rate or heard beat of a human being. For example, a user can place and press a finger (e.g., index finger or thumb) on the bidirectional display of a smartphone device. Then, the display panel can emit a light source of, for example, red color, to the finger and the image sensor panel can measure the light diffused in and reflected from the finger. The smartphone device can then analyze the temporal behavior of the reflected light detected by the image sensor panel to determine the heartbeat or pulse rate of the user.

As discussed above, a smartphone device having a bidirectional display of the present disclosure can also be used to capture a fingerprint. It has been reported that existing fingerprint scanners can be tampered easily by using an image copy of the user's finger. As such, simultaneous measurement of both fingerprint and pulse rate can ensure that the fingerprint is captured from an actual and living person. Accordingly, the bidirectional display of the preset disclosure can achieve enhanced security to prevent unauthorized access of the smartphone device or other transactions.

EXAMPLE SIX

Thermometer

In one embodiment, a display screen of a smartphone device can include an image sensor panel of the present disclosure. The image sensor panel can include dual-band sensor pixels that are sensitive to both infrared and visible light. Because only a small number of infrared sensitive pixels are required to take temperature measurement, it is appreciated that not all of the sensor pixels on the image sensor panel need to be sensitive to infrared light. In this embodiment, a user can simply place a display screen of a smartphone device in contact with the user's body surface (e.g., forehead) to measure black body radiation of the user's body, thereby determining the body temperature of the user.

EXAMPLE SEVEN

Data Entry

In this example, an IBS can be a document, a sheet of paper, a business card, and the like, on which encoded markings, such as a QR-code, a bar code (1D or 2D), and the like, are printed or otherwise attached thereon. The encoded markings can be decoded using a pre-determined algorithm. It is appreciated that a smartphone screen can also serve as an IBS, and the encoded markings can be displayed on the smartphone screen.

Various types of information can be included in the encoded markings. For example, the encoded markings can include address information of a desired destination (e.g., longitude, latitude, and/or sea level, or street address), computer instructions in textual form (e.g., computer codes written in a scripting language), media data in binary form (e.g., video data, audio data, image data, etc.), and the like. Any data included in the encoded markings on an IBS can be read by placing the IBS on an image sensor panel of the present disclosure. It is appreciated that, although focus is required, a rear or front camera of a smartphone device can also be used to read the IBS described herein.

In one embodiment, a vehicle navigation system can include an image sensor panel on its display screen and the encoded markings of an IBS can include destination information (e.g., street address, or latitude and longitude). In operation, a user can place the IBS proximate to or in contact with the screen surface of the vehicle navigation system. The vehicle navigation system then reads the destination information from the IBS and, in response, automatically finds and shows the destination on its display screen within only a few seconds. The user can click a confirm/start button on the navigation system, thereby beginning navigation to the destination.

In an alternative embodiment, a smartphone device can include an image sensor panel on its display screen and the encoded markings of an IBS can include computer instructions written in a scripting language. It is appreciated that the IBS having encoded markings can also be read using the rear or front camera of a smartphone device.

For example, an IBS can include encoded markings of computer instructions to be used in an emergency situation, such as, a car accident. Such computer instructions can be, for example:

```
<Begin>
Username = "John Doe"; InsuranceNo = "+1-202-321-9876";
    PolicyNo = "001122334455"; Police = "911";
    // Pre-defined variables
Loc = GetLocation ( ); // Get current location
    information and output result to variable Loc = [X, Y],
    wherein X=latitude, Y=longitude
Time = GetCurrentTime ( ); // Get current date and
    time and output result to variable Time
Contact = GetPhoneNumber ( ); // Get phone
    number of the present device
    and output to variable Contact
```

-continued

```
Msg1 = Call (Police, "$Username$ had a car
       accident at location $Loc$ on
       $Time$ and his/her contact number is
       $Contact$, please help!");
// Call police officer and provide information
       about the user's name, accident location and
       time, and the user's contact number. The output (e.g.,
       success or fail) is saved in variable Msg1.
Msg2 =Text (Insurance, "$Username$,
       whose policy number is $PolicyNo$
       had a car accident at location $Loc$ on $Time$");
// Send text message to insurance company
       and provide information on the user's name,
       insurance policy number, and accident
       location and time. The output (e.g., success or fail)
       is saved in variable Msg2.
<End>
```

When the IBS is scanned and read by an image sensor panel on a smartphone screen, for example, the above computer instructions trigger an interpreter module 1428 (see, for example, FIG. 14) executed on the smartphone device to run the computer instructions. In this embodiment, the computer instructions define four variables representing the user's name (i.e., "John Doe"); the user's vehicle insurance policy number (i.e., "001122334455"); the insurance company's contact number (i.e., "+1-617-987-6543"); and the emergency help line number ("911"). The interpreter module 1428 of smartphone device then obtains the current location information of the user by calling function "GetLocation( )", returns an output of latitude and longitude from the GPS component of the smartphone device, and write the output to variable "Loc" (e.g., Loc=[+42.12071232, −71.17251217], representing latitude and longitude of the accident location). The interpreter module 1428 also obtains the current date and time by calling function "GetCurrentTime( )" and obtains the smartphone device's phone number by calling function "GetPhoneNumber( )". The outputs of the functions are respectively stored in variables Time (e.g., "Jan. 1, 2015, 11:59:59 AM") and Contact (e.g., "+1-617-987-6543").

In addition, the interpreter module 1428 instructs the smartphone to call "911" recorded in variable "Police". After being connected with "911", the interpreter module 1428 instructs the smartphone to audibly read out a sentence of, for example, "John Doe had a car accident at location [+42.12071232, −71.17251217], on Jan. 1, 2015, 11:59:59 AM and his/her contact number is +1-617-987-6543, please help." If the above sentence is completely read to an officer, an output of SUCCESS will return from the function call and is written to the variable Msg1. Otherwise, an output of FAIL will return and write to variable Msg1. It is appreciated that, instead of calling the police by voice, the above sentence can be texted to a designated police station by using a "Text( )" function. The interpreter module 1428 can additionally or alternatively send a text message to the user's insurance company by calling a "Text( )" function. In this embodiment, the interpreter module 1428 sends to the insurance company a text message string of, for example, "John Doe, whose policy number is 001122334455, had a car accident at location [+42.12071232, −71.17251217], on Jan. 1, 2015, 11:59:59 AM." If the above text message string is sent to the insurance company, an output of SUCCESS will return from the function call and is written to the variable Msg2.

EXAMPLE EIGHT

Gaming

The bidirectional display device of the present disclosure can be used as a touchless user interface. In one scenario, a person playing a video game may stand or sit in front of a bidirectional display device of the present disclosure. For example, referring to FIG. 16A, the gaming software can configure image sensor panel 1610 into two input regions 1610L and 1610R. When the player interacts with the video game by gesture, input regions 1610L and 1610R can capture the player's gesture and determine the spatial coordinates of, for example, the player's body or hands. Such spatial coordinates can then be used to interact with different game characters or themes in the video game.

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue.

Although various embodiments of the present disclosure have been described in detail herein, one of ordinary skill in the art would readily appreciate modifications and other embodiments without departing from the spirit and scope of the present disclosure.

What is claimed is:

1. An image sensor device, comprising:
   a planar light source having a light emitting surface that emits uniform surface light; and
   an image sensor panel disposed directly on the light emitting surface of the planar light source, the image sensor panel being devoid of display pixels and comprising:
      a transparent substrate having a first surface,
      a sensor array formed on the first surface of the transparent substrate, the sensor array including a plurality of photosensitive pixels spaced apart from each other and arranged on the first surface to form a lattice structure, the sensor array defining a first region on the first surface, within which the photosensitive pixels are disposed, and a second region on the first surface other than the first region, the second region having an area greater than that of the first region,
      a light block layer formed on the transparent substrate of the image sensor panel and between the sensor array and the planar light source, wherein the light block layer includes a plurality of light block components formed in the first region to prevent the uniform surface light from reaching the photosensitive pixels,
   wherein the first region is optically non-transparent to visible light and the second region is optically transparent to visible light, thereby allowing at least a portion of the surface light to penetrate through the second region.

2. The device of claim 1, wherein each of the photosensitive pixels has a vertically stacked structure comprising a control component, a photosensitive component, and a dielectric layer between the control component and the photosensitive component, the control component being electrically coupled to the photosensitive component through a via hole of the dielectric layer.

3. The device of claim 2, wherein the vertically stacked structure further comprises a respective one of the light block components between the photosensitive component and the dielectric layer.

4. The device of claim 3, wherein said respective one of the light block components comprises an electrically conductive electrode.

5. The device of claim 1, wherein neighboring ones of the photosensitive pixels are separated by a separation distance of about 1.5 to 5 times of a lateral size of said neighboring ones of the photosensitive pixels.

6. An electronic device, comprising:
a display module comprising a plurality of display pixels that produces light signal from an emission surface of the display module, wherein the display pixels are configured to have a display resolution; and
an image sensor panel disposed on the display module, the sensor panel comprising:
a transparent substrate having a first surface,
a sensor array formed on the first surface of the transparent substrate, the sensor array including a plurality of photosensitive pixels spaced apart from each other and arranged on the first surface to form a lattice structure, the sensor array defining a first region on the first surface, within which the photosensitive pixels are disposed, and a second region on the first surface other than the first region, the second region having an area greater than that of the first region;
wherein the photosensitive pixels are configured to have a sensor resolution substantially greater than the display resolution; and
wherein the image sensor panel is optically non-transparent within the first region and optically transparent within the second region, so as to allow the light signal from the display pixels to penetrate through the second region.

7. The device of claim 6, further comprising a light block layer formed on the transparent substrate of the image sensor panel, wherein the light block layer includes a plurality of light block components formed in the first region.

8. The device of claim 6, wherein the display module comprises a liquid crystal display (LCD) device, wherein the display pixels are separated by a black matrix of the LCD device, and wherein the photosensitive pixels of the image sensor panel are aligned with the black matrix of the display module.

9. The device of claim 6, wherein the display module comprises an organic light emitting diode (OLED) display device, and wherein the display pixels of the display module are aligned with the second region of the image sensor panel.

10. The device of claim 6 wherein the sensor resolution is at least 1.4 times of the display resolution.

11. The device of claim 6, wherein neighboring ones of the photosensitive pixels are separated by a separation distance of about 1.5 to 5 times of a lateral size of said neighboring ones of the photosensitive pixels.

12. The device of claim 6, wherein the mobile electronic device is one of a smartphone device, a smart watch device, a handheld video game device, a tablet computer, and a laptop computer.

* * * * *